US 6,654,893 B1

(12) United States Patent
Samala

(10) Patent No.: US 6,654,893 B1
(45) Date of Patent: Nov. 25, 2003

(54) SYSTEM AND METHOD OF OPERATING A DYNAMIC FLIP-FLOP IN POWER DOWN MODE WITH SHUT-OFF CIRCUIT

(75) Inventor: Jaya Prakash Samala, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 594 days.

(21) Appl. No.: 09/586,476

(22) Filed: Jun. 1, 2000

Related U.S. Application Data

(60) Provisional application No. 60/199,486, filed on Apr. 25, 2000.

(51) Int. Cl.[7] .................................................. G06F 1/32
(52) U.S. Cl. ....................................... 713/300; 713/324
(58) Field of Search .......................................... 713/300

(56) References Cited

U.S. PATENT DOCUMENTS

| | | | | |
|---|---|---|---|---|
| 4,631,420 A | | 12/1986 | Hollis et al. ............. | 307/272 R |
| 5,898,330 A | | 4/1999 | Klass ......................... | 327/210 |
| 5,900,758 A | * | 5/1999 | Kanno ........................ | 327/201 |
| 5,949,266 A | | 9/1999 | Hinds et al. ................ | 327/208 |
| 6,188,259 B1 | * | 2/2001 | Amir et al. ................. | 327/198 |
| 6,222,404 B1 | * | 4/2001 | Mehta et al. ............... | 327/200 |
| 6,265,923 B1 | * | 7/2001 | Amir et al. ................. | 327/218 |
| 6,288,932 B1 | | 9/2001 | Samala ....................... | 365/154 |
| 6,424,195 B2 | * | 7/2002 | Samala ....................... | 327/211 |

FOREIGN PATENT DOCUMENTS

JP          405090913 A   *   4/1993   .......... H03K/3/037

OTHER PUBLICATIONS

IBM TDB vol. 21, Issue 1, pp. 415–418, Title: AC Powered Pulse Generator for Latching Logic, Jun. 1978.*

* cited by examiner

Primary Examiner—Thomas Lee
Assistant Examiner—Nitin Patel
(74) Attorney, Agent, or Firm—Thelen Reid & Priest LLP; Marc S. Hanish

(57) ABSTRACT

A dynamic flip-flop includes a first input latch coupled to receive a data input signal and a second input latch coupled to receive the complement of the data input signal. The first input latch has a first shutoff mechanism and the second input latch has a second shutoff mechanism. During a precharge phase, the first and second input latches each provide an output signal. During an evaluation phase, the first and second input latches sample the data input signal and complemented data input signal if a compare enable signal is activated. The shutoff mechanisms as well will then only activate if the compare enable signal is activated. This allows the circuit to save power because flip-flop will not execute a compare during each clock cycle.

22 Claims, 4 Drawing Sheets

US 6,654,893 B1

SYSTEM AND METHOD OF OPERATING A DYNAMIC FLIP-FLOP IN POWER DOWN MODE WITH SHUT-OFF CIRCUIT

STATEMENT OF RELATED APPLICATION

This application claims priority based on provisional application serial No. 60/199,486, entitled "Dynamic Flop with Power Down Mode" by Jaya Prakash Samala, filed on Apr. 25, 2000, and is related to application entitled "Dynamic Flop with Power Down Mode" by Jaya Prakash Samala, filed on Jun. 1, 2000, now U.S. Pat. No. 6,288,932 B1 issued on Sep. 11, 2002, and is also related to U.S. Pat. No. 6,424,195 B2, entitled "Dynamic Flop with Power Down Mode" by Jaya Prakash Samala, issued on Jul. 23, 2002, which is a division of U.S. Pat. No. 6,288,932 B1.

BACKGROUND OF THE INVENTION

1. Field of the Invention

The present invention relates to electronics. More specifically, the present invention relates to a dynamic flop design having a power down mode.

2. The Background

Dynamic flip-flops have been used in memories for many years. The advantage of using dynamic flip-flops over static flip-flops comes in the fact that they often have shorter delays, thus allowing the overall circuit to run faster. Typically dynamic flip-flops have a precharge phase and an evaluation phase.

A common problem occurs with dynamic flip-flops when static flip-flops are used to drive them. Conventional static flip-flops have uncertainty as their output signals become stable. Therefore, the time required for the static flip-flop's output signals to become stable may extend into the evaluation phase of the dynamic flip-flop being driven by it.

One solution that has been offered for this problem is to provide a flip flop with a self-shut-off mechanism. FIG. 1 is a schematic diagram illustrating a dynamic flip-flop with a self-shut-off mechanism. The dynamic flip flop 50 includes a first input latch 52 with a shutoff circuit 54, a second input latch 56 with a shutoff circuit 58, and output latches 60 and 62. The substantially identical input latches 52, 56 are coupled to receive clock signal CK. Additionally, the first input latch 52 is coupled to receive the data input signal D. An inverter INV1 may also be coupled to receive the data input signal D. The second input latch 56 then receives the complement of the data input signal $\overline{D}$ from the inverter INV1.

The first input latch 52 provides an output signal to an input lead of the first output latch 60, through an output node OUT1N. Similarly, the second input latch 56 provides an output signal to an input lead of the second output latch 62, through an output node OUT2N. The shutoff circuits 54 and 58 have input leads connected to the output nodes, OUT2N and OUT1N, respectively. The substantially identical output latches 60 and 62 also have output leads connected to the Q and $\overline{Q}$ output terminals of the dynamic flip-flop 50.

This dynamic flip-flop operates as follows. During the logic low portion of each cycle of the clock signal CK, the dynamic flip-flop circuit 50 is in the precharge phase. The input latches 52 and 56 sample the data input signal D and the complemented data input $\overline{D}$, respectively. The input latches 52,56 each output the complement of its corresponding sample input signal. Consequently, if the data input signal D is at a logic high level, the first input latch 52 will output a logic low level on the output node OUT1N and the second input latch 56 will output a logic high level on the output node OUT2N. In response to the logic levels on the output nodes OUT1N and OUT2N, the output latches 60 and 62 will generate a logic high level Q output signal and a logic low level $\overline{Q}$ output signal, respectively.

The input latches 52 and 56 each output the complement of its corresponding sampled input signal. Consequently, if the data input signal D is at a logic high level, the input latch 52 will output a logic low level on the output node OUT1N and the input latch 54 will output a logic high level on the output node OUT2N. In response to the logic levels on the output nodes OUT1N and OUT2N, the output latches 60 and 62 will generate a logic high level Q output signal and a logic low level $\overline{Q}$ output signal, respectively.

In addition, in response to the logic low level on the output node OUT1N, the shutoff circuit 58 disables the input latch 56. As a result, the shutoff circuit 58 operates to prevent the input latch 56 from sampling the complemented data input signal $\overline{D}$ after the latch 56 causes the output node OUT1N transitions to a logic low level. Thus, the sampling window is approximately equal to the time needed by the input latch 52 to generate the logic low level on the output node OUT1N, plus the propagation delay of the shutoff circuit 58. This relatively short sampling window implements "edge-triggering" because the logic level is, in effect, sampled only at the rising edge of the clock signal CK. After being disabled during the evaluation phase, the logic levels at the output leads of the latches 52 and 56 are maintained throughout the remainder of the evaluation phase.

The first input latch 52 is implemented so that once the output node OUT1N is discharged (i.e., when the input latch 52 receives a logic high level data input signal D), a subsequent high-to-low transition of the data input signal D does not cause the logic level at the output node OUT1N to change. Alternatively, the shutoff circuit 54 can also monitor the logic level on the output node OUT1N and disable the first input latch 52 in response to the logic level transitioning to a logic low level.

Conversely, if at the start of the evaluation phase the data input signal D is at a logic low level, the first input latch 52 will output a logic high level on the output node OUT1N and the second input latch 56 will output a logic low level on the output node OUT2N. In response to the output signals on the output nodes OUT1N and OUT2N, the output latches 60 and 62 will provide a logic low level Q output signal and a logic high level $\overline{Q}$ output signal, respectively. The logic low level at the output node OUT2N also causes the shutoff circuit 54 to disable the first input latch 52, thereby helping implement the edge-triggered feature of the dynamic flip-flop circuit 50.

The input latch 52 includes p-channel transistors PC1 and K2, n-channel transistors S1, N1 and EVAL, and inverters INV2 and INV3. The n-channel transistor S1 and the inverters INV2 and INV3 implement the shutoff circuit 54.

The p-channel transistor PC1 has its gate coupled to receive the clock signal CK, its source coupled to a VDD voltage source (i.e, the VDD rail) and its drain connected to the output node OUT1N. The output node OUT1N is also connected to the drain of the n-channel transistor S1. The gate of the n-channel transistor S1 is coupled to the output node OUT2N through series connected inverters INV2 and INV3, where the output lead of the inverter INV2 is connected to the gate of the n-channel transistor S1, and the input lead of the inverter INV3 is connected to the output node OUT2N. The source of the n-channel transistor S2 is connected to the drain of the n-channel transistor N1. The n-channel transistor N1 has its gate coupled to receive the data input signal D, and its source connected to the drain of the n-channel transistor EVAL at the node CGND. The n-channel transistor EVAL has its gate coupled to receive the clock signal CK and its source coupled to a VSS voltage source (i.e., the VSS rail).

The second input latch 56 includes p-channel transistors K1 and PC2, n-channel transistors S2 and N2, and inverters INV4 and INV5. The second input latch 56 shares the n-channel transistor EVAL with the first input latch 52. In addition, the n-channel transistor S2 and the inverters INV4 and ISV5 implement the shutoff circuit 58. The second input latch 56 is substantially identical to the first input latch 52, except that the second input latch 56 is implemented with the transistors PC2, K1, S2 and N2 in place of the transistors PC1, K2, S1 and N1, and with the inverters INV4 and INV5 in place of the inverters INV2 and INV3. In addition, the second input latch 56 receives the complemented data input signal $\overline{Q}$ through the inverter INV1 at the gate of the n-channel transistor N2.

The first output latch 60 includes an inverter INV6 and a n-channel transistor N3. The input lead of the inverter INV6 is connected to the output node OUT1N. The output lead of the inverter INV6 is connected to the Q output terminal of the dynamic flip-flop circuit 50 and the gate of the n-channel transistor N3. The n-channel transistor N3 has its source connected to the VSS voltage source, and its drain connected to the input lead of the inverter INV6.

The second output latch 62 includes an inverter INV7 and a n-channel transistor N4. The input lead of the inverter INV7 is connected to the output node OUT2N. The output lead of the inverter INV7 is connected to the $\overline{Q}$ output terminal of the dynamic flip-flop circuit 50 and the gate of the n-channel transistor N4. The n-channel transistor N4 has its source connected to the VSS voltage rail, and its drain connected to the input lead of the inverter INV7.

FIG. 2 is a timing diagram illustrating the operation of the dynamic flip-flop circuit of FIG. 1. Referring to FIGS. 1 and 2 together, the dynamic flip-flop circuit 50 of FIG. 1 operates as follows. When the clock signal CK is at a logic low level, the dynamic flip-flop circuit 50 is in the precharge phase, as indicated by the waveform 101. Consequently, the precharge devices (i.e., the p-channel transistors PC and PC2) are turned on and the n-channel transistor EVAL is turned off. Because the n-channel transistor EVAL is off, the p-channel transistors PC and PC2 pull up the voltage at the output nodes OUT1N and OUT2N to approximately the VDD rail voltage, thereby precharging the output nodes OUT1N and OUT2N. Thus, the keeper devices (i.e., p-channel transistors K1 and K2) are turned off. The logic high level at the output nodes OUT1N and OUT2N causes the shutoff devices (i.e., n-channel transistors S1 and S2) to turn on, after the two inverter delays incurred by the two series connected inverters in each of shutoff circuits 54 and 58.

In addition, the logic high level at the output nodes OUT1N and OUT2N, respectively, propagate through the inverters INV6 and INV7, causing the Q and $\overline{Q}$ output signals to be at a logic low level during the precharge phase, as indicated by the solid line portions of the waveforms 103 and 105. The logic low Q and $\overline{Q}$ output signals cause the n-channel transistors N3 and N4 to be off. In this example, the Q output signal was at a logic low level (with the $\overline{Q}$ output signal being at a logic high level) during the previous evaluation phase. The dashed line portions 103A and 105A represent the Q and $\overline{Q}$ output signals resulting from the Q output signal being at a logic high level during the previous evaluation phase.

When the clock signal CK transitions to a logic high level (i.e., low-to-high), the n-channel transistor EVAL is turned on, which places the dynamic flip-flop circuit 50 in the evaluation phase. The n-channel transistor EVAL pulls down the voltage at the node CGND to approximately the VSS rail voltage. In addition, the low-to-high transition of the clock signal CK also turns off the precharge devices PC1 and PC2.

The data input signal D is provided to the dynamic flip-flop circuit 50 such that it is stable before the low-to-high transition, as shown by waveform 107. The data input signal D need not be stable except at around the beginning of the evaluation phase. If the data input signal D is at a logic high level when the evaluation phase begins, the n-channel transistor N1 is turned on while the n-channel transistor N2 is turned off. Because the n-channel transistor N1 is on, the voltage at the output node OUT1N is pulled to about the VSS rail voltage through the n-channel transistors S1, N1 and EVAL. Thus, the input latch 52 provides a logic low output signal at the output node OUT1N, which turns on the p-channel transistor K1 to help keep the voltage at the output node OUT2N at a logic high level. The logic low level at the output node OUT1N also propagates through the inverter INV6. As a result, the Q output signal transitions from low-to-high, as shown by portion 109 of the waveform 103. The logic high level of the Q output signal turns on the n-channel transistor N3, which helps to further pull down the voltage at the output node OUT1N.

The logic low level at the output node OUT1N also propagates through the inverters INV4 and INV5, resulting in the gate voltage X1 of the n-channel transistor S2 being driven to a logic low level. Consequently, the shutoff device S2 is turned off. As a result, the second input latch 56 is disabled from sampling the voltage of the complemented data input signal $\overline{D}$. Because the n-channel transistor S2 is off, the second input latch 56 now cannot discharge the output node OUT2N even if the data input signal D were to subsequently transition to a logic low level during this evaluation phase. Thus, the $\overline{Q}$ output signal remains at a logic low level, as indicated by the portion 111 of the waveform 105. Further, if the data input signal D were to transition to a logic low level after the output node OUT1N was discharged, the n-channel transistor N1 would be turned off, but the n-channel transistor N3 keeps the voltage at the output node OUT1N at a logic low level.

The two stage design of the dynamic-flip-flop circuit 50 greatly increases the speed of the flip-flop circuit compared to conventional static flip-flop designs. However, this design has a major drawback in that it wastes power. During each cycle, power is consumed due to the charging and discharging of dynamic flops. While this may be efficient enough for memories that are frequently accessed, for memories that are less frequently accessed there is a tremendous waste of power. In Content Addressable Memories, a look-up operation is not always used, or at least not used on every cycle. Yet, if the circuit design described above was used, power would be consumed on every cycle. What is needed is a design which eliminates the delay associated with static flip-flops, yet does not waste as much power as prior art dynamic flip-flops do.

SUMMARY OF THE INVENTION

A dynamic flip-flop includes a first input latch coupled to receive a data input signal and a second input latch coupled to receive the complement of the data input signal. The first input latch has a first shutoff mechanism and the second input latch has a second shutoff mechanism. During a precharge phase, the first and second input latches each provide an output signal. During an evaluation phase, the first and second input latches sample the data input signal and complemented data input signal if a compare enable signal is activated. The shutoff mechanisms as well will then only activate if the compare enable signal is activated. This allows the circuit to save power because flip-flop will not execute a compare during each clock cycle.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons after review of this disclosure.

Figure 1:
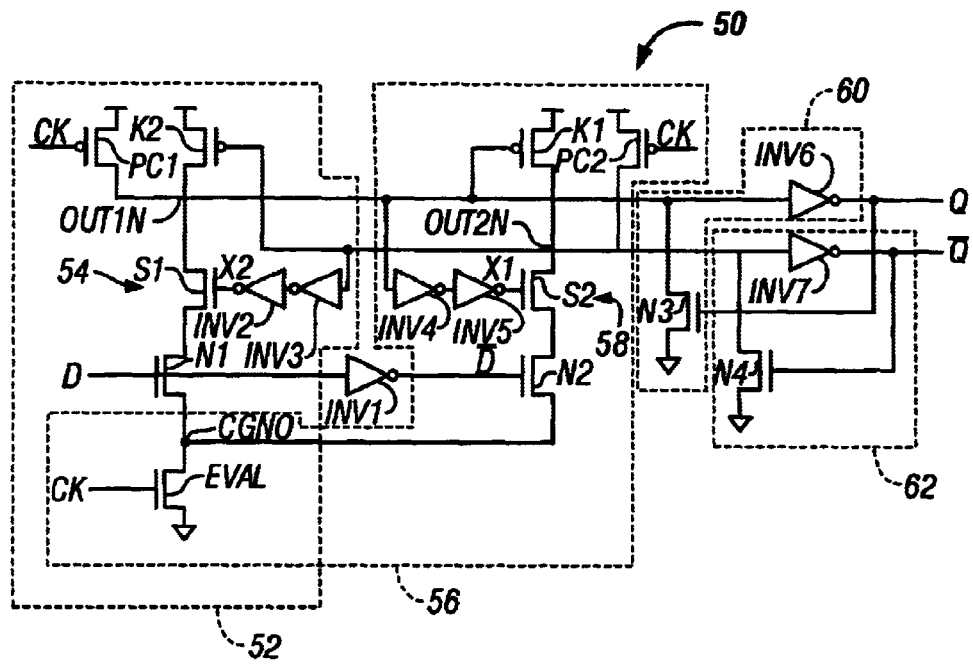
FIG. 1 is a schematic diagram illustrating a dynamic flip-flop with a self-shutoff mechanism.
Figure 2:
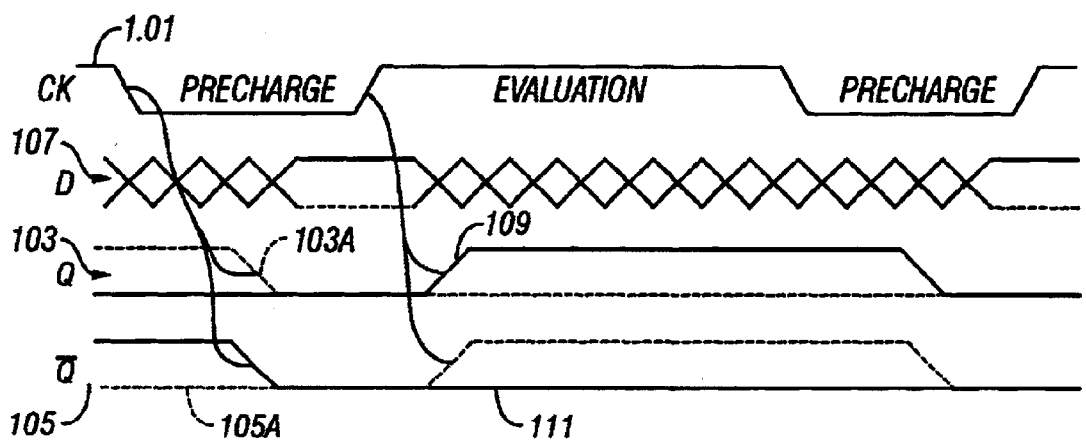
FIG. 2 is a timing diagram illustrating the operation of the dynamic flip-flop circuit of FIG. 1.
Figure 3:
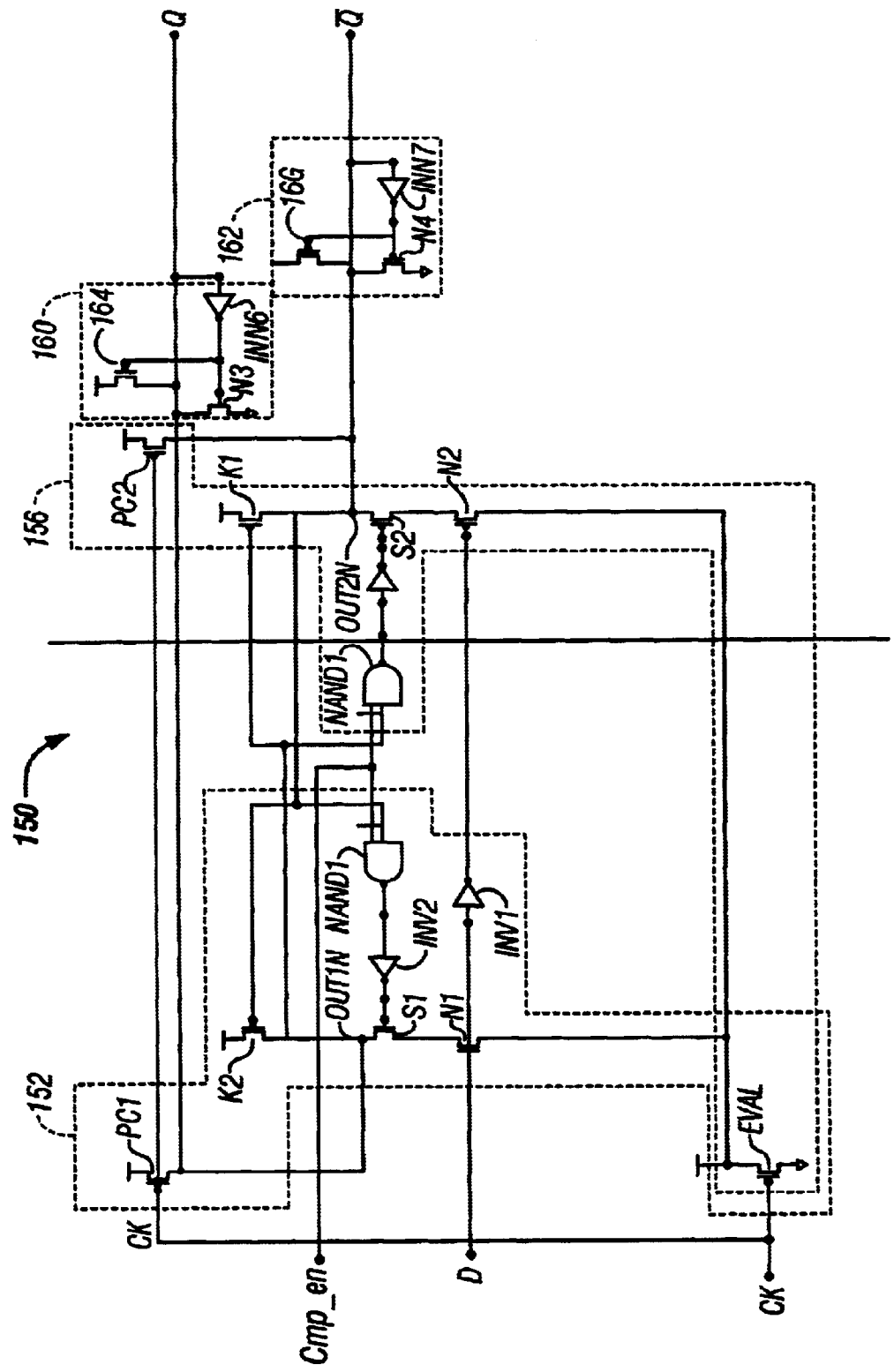
FIG. 3 is a schematic diagram illustrating a dynamic flip-flop with a power down mechanism in accordance with a presently preferred embodiment of the present invention.

FIG. 3 is a schematic diagram illustrating a dynamic flip-flop with a power down mechanism in accordance with a presently preferred embodiment of the present invention. The dynamic flip-flop 150 includes a first input latch 152 with a shutoff circuit 154, a second input latch 156 with a shutoff circuit 158, and output latches 160 and 162. The substantially identical input latches 152, 156 are coupled to receive clock signal CK. Additionally, the first input latch 152 is coupled to receive the data input signal D. An inverter INV1 may also be coupled to receive the data input signal D. The second input latch 156 then receives the complement of the data input signal $\overline{D}$ from the inverter INV1.

The first input latch 152 provides an output signal to an input lead of the first output latch 160, through an output node OUT1N. Similarly, the second input latch 156 provides an output signal to an input lead of the second output latch 162, through an output node OUT2N. The shutoff circuits 154, 156 have input leads connected to the output nodes, OUT1N and OUT2N, respectively. The substantially identical output latches 160 and 162 also have output leads connected to the Q and $\overline{Q}$ output terminals of the dynamic flip-flop 150.

A compare enable line (cmp_en) is provided which is coupled to the first and second input latches 152, 156 such that, when the contents of the flip-flop 150 are to be evaluated or compared, the line is driven high. As will be seen, the architecture of the. dynamic flip-flop 150 provides that when the compare enable line (cmp_en) is low, no power is drawn, even if the clock line is high (in the traditional "evaluation" phase).

The first input latch 152 includes p-channel transistors PC1 and K2, n-channel transistors S1, N1, and EVAL, inverter INV2 and nand gate NAND1. The n-channel transistor S1, the inverter INV2, and the nand gate NAND1 implement the shutoff circuit 154.

The p-channel transistor PC1 has its gate coupled to receive the clock signal CK, its source coupled to a VDD voltage source (i.e. the VDD rail) and its drain connected to the output node OUT1N. The output node OUT1N is also connected to the drain of the n-channel transistor S1. The gate of the n-channel transistor S1 is coupled to the output node OUT2N through inverter INV2 and nand gate NAND1, where the output lead of the inverter INV2 is connected to the gate of the n-channel transistor S1, and one of the input leads of nand gate NAND1 is connected to the output node OUT2N. The source of the n-channel transistor S2 is connected to the drain of the n-channel transistor N1. The n-channel transistor N1 has its gate coupled to receive the data input signal D, and its source connected to the drain of the n-channel transistor EVAL at the node CGND. The n-channel transistor EVAL has its gate coupled to receive the clock signal CK and its source coupled to a VSS voltage source (i.e. the VSS rail).

The second input latch 156 include p-channel transistors K1 and PC2, n-channel transistors S2 and N2, inverter INV3, and nand gate NAND2. The second input latch 156 shares the n-channel transistor EVAL with the first input latch 152. In addition, the n-channel transistor S2, the inverter INV3, and the nand gate NAND2 implement the shutoff circuit 158. The second input latch 156 is substantially identical to the first input latch 152, except that the second input latch 156 is implemented with the transistors PC2, K1, S2, and N2 in place of the transistors PC1, K2, S1, and N1, with the inverter INV3 in place of the inverter INV2, and the nand gate NAND2 in the place of the nand gate NAND1. In addition, the second input latch 156 receives the complemented data input signal $\overline{Q}$ through the inverter INV1 at the gate of the n-channel transistor N2.

The compare enable signal (cmp_en) is also coupled to input leads of nand gates NAND1 and NAND2. Therefore, the flip-flop only draws power when both the cmp_en and CK signals are driven high, preventing the unnecessary usage of power when there is no memory access yet the clock is still in the high part of its cycle.

The first output latch 160 includes an inverter INV6 and an n-channel transistor N3. The input lead of the inverter INV6 is connected to the Q output terminal of the dynamic flip-flop circuit 150 and its output connected to n-channel transistor N3. The n-channel transistor N3 has its source connected to the VSS voltage source, and its drain connected to the Q output terminal of the dynamic flip flop circuit 150.

The second output latch 162 includes in inverter INV7 and an n-channel transistor N4. The input lead of the inverter INV7 is connected to the $\overline{Q}$ output terminal of the dynamic flip-flop circuit 150 and its output connected to the n-channel transistor N4. The n-channel transistor N4 has its source connected to the VSS voltage rail, and its drain connected to the $\overline{Q}$ output terminal of the dynamic flip-flop circuit 150.

Figure 4:
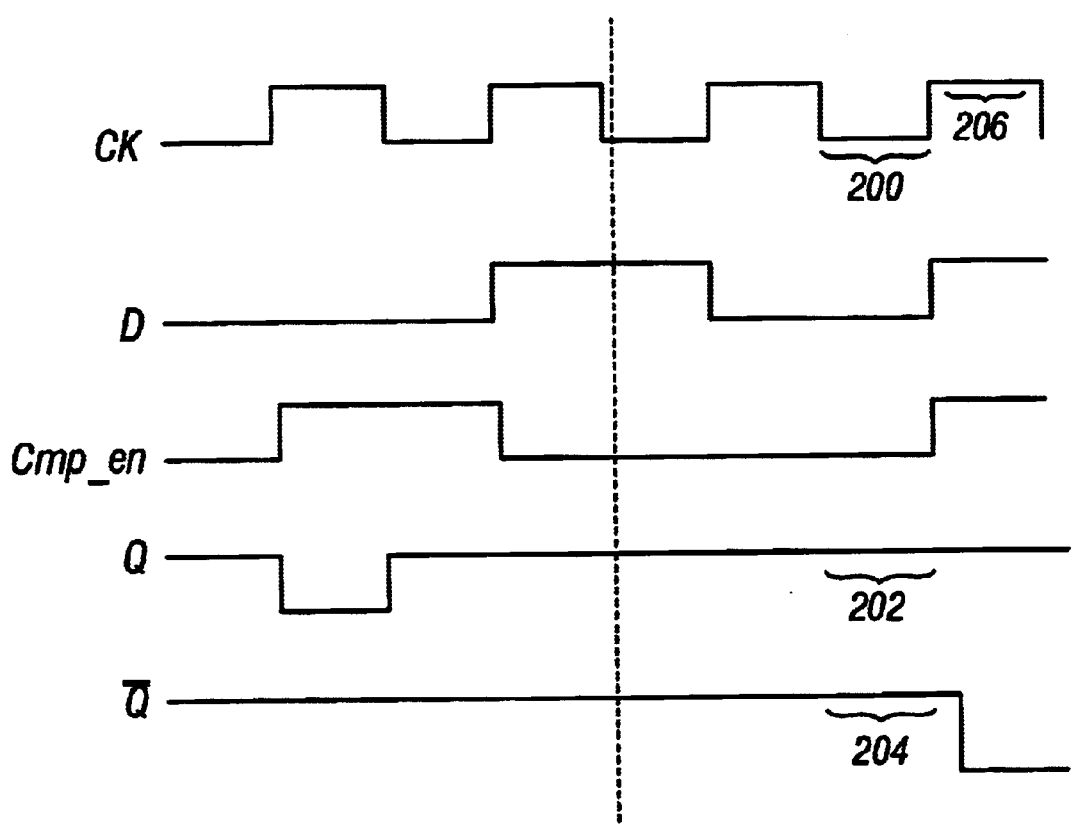
FIG. 4 is a timing diagram illustrating the operation of the dynamic flip-flop of FIG. 3 in accordance with a presently preferred embodiment of the present invention.

FIG. 4 is a timing diagram illustrating the operation of the dynamic flip-flop of FIG. 3 in accordance with a presently preferred embodiment of the present invention. Referring to FIGS. 3 and 4 together, the dynamic flip-flop circuit 150 of FIG. 3 operates as follows. When the clock signal CK is at a logic low level, the dynamic flip-flop circuit 150 is in the precharge phase, as indicated by reference numeral 200. Consequently, the precharge devices (i.e. the p-channel transistors PC1 and PC2) are turned on and the n-channel transistor EVAL is turned off. Because the n-channel transistor EVAL is off, the p-channel transistors PC1 and PC2 pull up the voltage at the output nodes OUT1N and OUT2N to approximately the VDD rail voltage, thereby precharging the output nodes OUT1N and OUT2N. Thus, the keeper devices (i.e. p-channel transistors K1 and K2) are turned off. The logic high level at the output nodes OUT1N and OUT2N causes the shutoff devices (i.e., n-channel transistors S1 and S2) to turn on, after the two delays caused by the inverter and nand gate in each of the shutoff circuits 154 and 158.

In addition, the logic high level at the output nodes OUT1N and OUT2N, respectively, propagate straight through to the output, causing the Q and $\overline{Q}$ output signals to be at a logic high level during the precharge phase, as indicated by reference numerals 202 and 204.

When the clock signal CK transitions to a logic high level (i.e. low-to-high) as indicated by reference numeral 206, the n-channel transistor EVAL is turned on, which places the dynamic flip flop circuit 150 in the evaluation phase. However, as will be seen, the flip-flop will not actually use power unless the compare enable line (cmp_en) is driven high.

The n-channel transistor EVAL drives the voltage at CGND to the VSS rail voltage. In addition, the low-to-high transition of the clock signal CK also turns off the precharge devices PC1 and PC2.

If the data input signal D is at a logic high level when the evaluation phase begins, the n-channel transistor N1 is turned on while the n-channel transistor N2 is turned off. Because the n-channel transistor N1 is on, the voltage at the output node OUT1N is pulled to the VSS rail voltage through the n-channel transistors S1, N1, and EVAL. Thus, the first input latch 152 provides a logic low output signal at the output node OUT1N, which turns on the p-channel transistor K1 to help keep the voltage at the output node OUT2N at a logic high level. The logic low level at the output node OUT1N also propagates through the inverter INV6. As a result, the Q output signal turns on the n-channel transistor N3, which helps to further pull down the voltage at the output node OUT1N.

The logic low level at the output node OUT1N also propagates to one of the inputs of nand gate NAND2. The other input of nand gate NAN2 is the compare enable line (cmp_en). Thus, the gate voltage X1 of the n-channel transistor S2 is only driven to a logic low level if the compare enable line (cmp_en) is high. Therefore, the shutoff device is only turned off if the cmp_en line is high.

Figure 5:
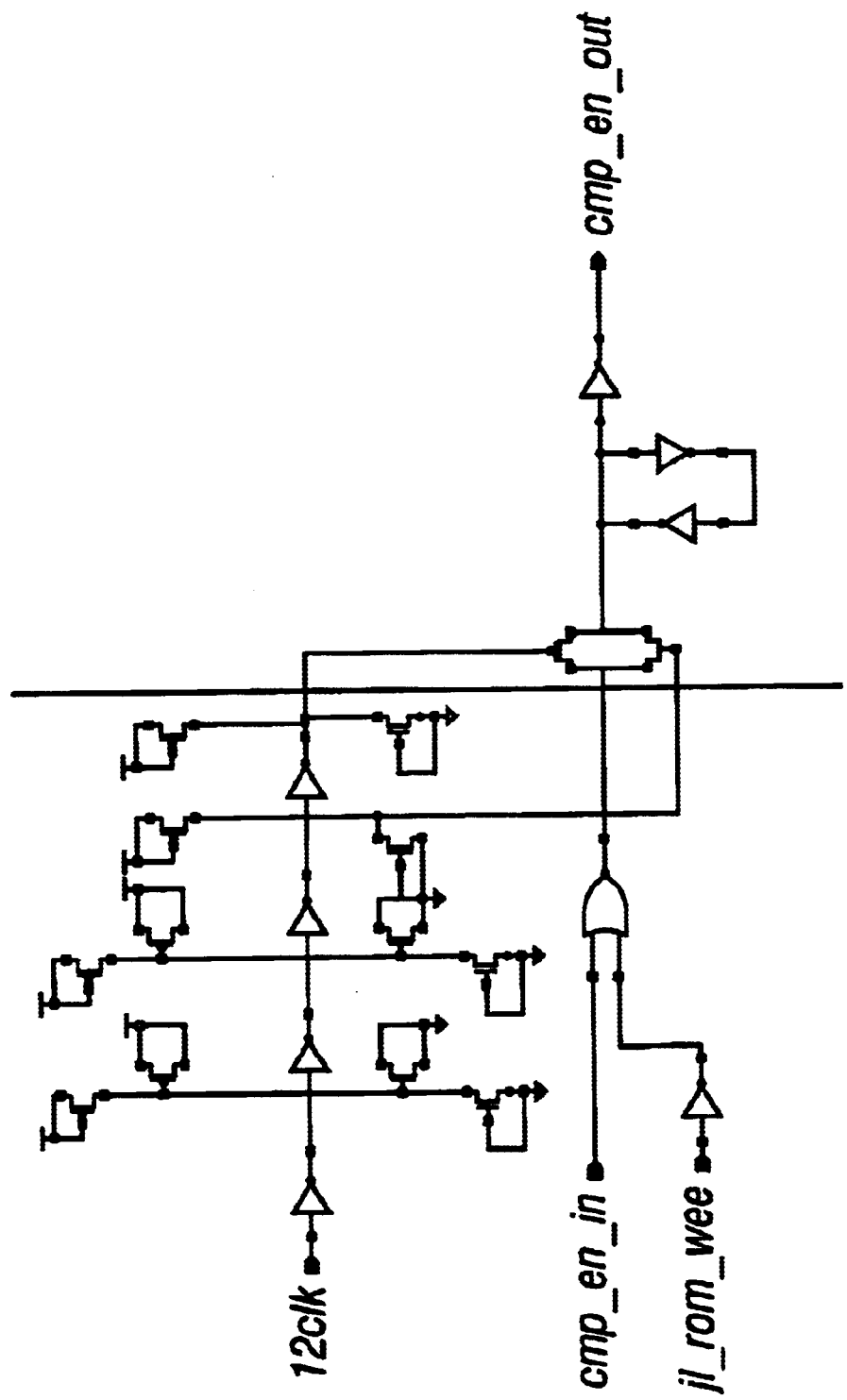
FIG. 5 is a schematic diagram illustrating a latch in accordance with a presently preferred embodiment of the present invention.

This design prevents the wasting of power when using devices such as Content Addressable Memories, where a lookup operation is not executed on every clock cycle. One problem, however, that may be encountered is if the compare enable line (cmp_en) is driven high during the middle of the evaluation phase. In this case, the circuit may not catch it as a signal to read from the circuit. Therefore, to prevent such cases, a latch may be placed on the cmp_en line so that it may only go positive during the negative phase of the clock signal (i.e. when CK is low). FIG. 5 is a schematic diagram illustrating a latch in accordance with a presently preferred embodiment of the present invention.

Another potential problem encountered when using the dynamic flip flop circuit 150 is that for very low frequency cycles, there is the possibility of leakage of the precharge. Many computer now utilize "sleep modes", where memory accesses are limited and the clock is slowed down (to, for example, 1MHz). While such a low frequency would normally not present a problem in a dynamic flip-flop where the flip-flop is driven every cycle, in a flip-flop according to a presently preferred embodiment of the present invention, such long phases might present a problem. Therefore, a regenerative circuit 164, 166 which is designed to work with the first and second output latches 160, 162 to regenerate a high logic level on the Q or $\overline{Q}$ line if they fall too low.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for operating a dynamic flip-flop circuit including an input latch and an output latch, the input latch including a shutoff circuit, said method comprising:

providing a clock signal to the input latch, the clock signal alternating between a first logic level and a second logic level;

providing a data signal to the input latch, the input latch being operative to sample the data signal when the data signal is logic high and the clock signal is logic high;

providing a compare enable signal to the shutoff circuit; and driving the compare enable signal logic high when data is to be compared in the flip-flop circuit, the shutoff circuit being activated when the data signal is logic high and the clock signal is logic high only if the compare enable signal is also logic high.

2. The method of claim 1, wherein said driving includes:

ensuring that the compare enable signal is driven logic high before the clock signal goes logic high.

3. The method of claim 1, further comprising:

periodically recharging an output of the output latch such that an output signal level is maintained at a predetermined voltage level when the compare enable signal remains logic low.

4. A method for implementing a dynamic flip-flop circuit having a first phase and a second phase of operation, said method comprising:

providing a first output signal of a first logic level during the a first phase of operation;

providing a data signal at about a transition from the first phase of operation to the second phase of operation;

providing an enable signal, the enable signal having a first logic level when the data signal is to be sampled, sampling the data signal at about a transition from the first phase of operation to the second phase of operation if the enable signal has the first logic level;

driving the first output signal to a second logic level in response to said sampling of the data signal; and disabling said sampling of the data signal in response to driving the first output signal to the second logic level if the enable signal has the first logic level.

5. The method of claim 4, wherein said providing the enable signal further includes:

ensuring that the enable signal is driven to the first logic level before the second phase of operation starts.

6. The method of claim 4, further comprising:

periodically recharging a second output signal such that the second output signal maintains a predetermined voltage level when the enable signal has a second logic level.

7. An apparatus for operating a dynamic flip-flop circuit including an input latch and an output latch, the input latch including a shutoff circuit, said apparatus comprising:

means for providing a clock signal to the input latch, the clock signal alternating between a first logic level and a second logic level;

means for providing a data signal to the input latch, the input latch being operative to sample the data signal when the data signal is logic high and the clock signal is logic high;

means for providing a compare enable signal to the shutoff circuit; and means for driving the compare enable signal logic high when data is to be compared in the flip-flop circuit, the shutoff circuit being activated when the data signal is logic high and the clock signal is logic high only if the compare enable signal is also logic high.

8. The apparatus of claim 7, wherein said means for driving includes:

means for ensuring that the compare enable signal is driven logic high before the clock signal goes logic high.

9. The apparatus of claim 7, further comprising:

means for periodically recharging an output of the output latch such that an output signal level is maintained at a predetermined voltage level when the compare enable signal remains logic low.

10. An apparatus for implementing a dynamic flip-flop circuit having a first phase and a second phase of operation, said apparatus comprising:

means for providing a first output signal of a first logic level during the a first phase of operation;

means for providing a data signal at about a transition from the first phase of operation to the second phase of operation;

means for providing an enable signal, the enable signal having a first logic level when the data signal is to be sampled;

means for sampling the data signal at about a transition from the first phase of operation to the second phase of operation if the enable signal has the first logic level;

means for driving the first output signal to a second logic level in response to the sampling of the data signal; and means for disabling said sampling of the data signal in response to driving the first output signal to the second logic level if the enable signal has the first logic level.

11. The apparatus of claim 10, wherein said means for providing the enable signal further includes:

means for ensuring that the enable signal is driven to the first logic level before the second phase of operation starts.

12. The apparatus of claim 10, further comprising:

means for periodically recharging a second output signal such that the second output signal maintains a predetermined voltage level when the enable signal has a second logic level.

13. A program storage device readable by a machine, tangibly embodying a program of instructions executable by the machine to perform a method for operating a dynamic flip-flop circuit, including an input latch and an output latch, the input latch including a shutoff circuit, said method comprising:

providing a clock signal to the input latch, the clock signal alternating between a first logic level and a second logic level;

providing a data signal to the input latch, the input latch being operative to sample the data signal when the data signal is logic high and the clock signal is logic high;

providing a compare enable signal to the shutoff circuit; and driving the compare enable signal logic high when data is to be compared in the flip-flop circuit, the shutoff circuit being activated when the data signal is logic high and the clock signal is logic high only if the compare enable signal is also logic high.

14. A method for operating a dynamic flip-flop circuit including an input latch and an output latch, the input latch including a shutoff circuit, said method comprising:

receiving a clock signal and a data signal at the input latch;

receiving a compare enable signal at the shutoff circuit, the compare enable signal being driven logic high when data is to be compared in the flip-flop circuit;

outputting from the input latch a first output signal of a first logic level (H) when the clock signal is logic low;

sampling the data signal at the input latch when the data signal is logic high and the clock signal goes logic high;

driving the first output signal to a second logic level (L) when the data signal is logic high and the clock signal goes logic high; and activating the shutoff circuit so as to disable said sampling in response to the first output signal driven to the second logic level if the enable signal is logic high.

15. The method in accordance with claim 14, further comprising:

outputting from the output latch a second output signal having a logic level corresponding to the data signal level.

16. The method in accordance with claim 14, further comprising:

ensuring that the compare enable signal is driven logic high before the clock signal goes logic high.

17. The method in accordance with claim 14, further comprising:

periodically recharging an output node of the output latch such that an output signal level is maintained at a predetermined voltage level when the compare enable signal remains logic low.

18. An apparatus for operating a dynamic flip-flop circuit, said apparatus comprising:

means for receiving a clock signal and a data signal;

means for receiving a compare enable signal;

means for driving the compare enable signal logic high when data is to be compared in the flip-flop circuit;

means for outputting a first output signal of a first logic level (H) when the clock signal is logic low;

means for sampling the data signal when the data signal is logic high and the clock signal goes logic high;

means for driving the first output signal to a second logic level (L) when the data signal is logic high and the clock signal goes logic high; and means for activating a shutoff circuit so as to disable said means for sampling in response to the first output signal driven to the second logic level if the enable signal is logic high.

19. The apparatus in accordance with claim 18, further comprising:

means for outputting a second output signal having a logic level corresponding to a logic level of the data signal.

20. The apparatus in accordance with claim 18, further comprising:

means for ensuring that the compare enable signal is driven logic high before the clock signal goes logic high.

21. The apparatus in accordance with claim 18, further comprising:

means for periodically recharging an output node of the output latch such that an output signal level is maintained at a predetermined voltage level when the compare enable signal remains logic low.

22. A program storage device readable by a machine, tangibly embodying a program of instructions executable by the machine to perform method for operating a dynamic flip-flop circuit including an input latch and an output latch, the input latch including a shutoff circuit, said method comprising:

receiving a clock signal and a data signal at the input latch;

receiving a compare enable signal at the shutoff circuit, the compare enable signal being driven logic high when data is to be compared in the flip-flop circuit;

outputting from the input latch a first output signal of a first logic level (H) when the clock signal is logic low;

sampling the data signal at the input latch when the data signal is logic high and the clock signal goes logic high;

driving the first output signal to a second logic level (L) when the data signal is logic high and the clock signal goes logic high; and activating the shutoff circuit so as to disable said sampling in response to the first output signal driven to the second logic level if the enable signal is logic high.

* * * * *

UNITED STATES PATENT AND TRADEMARK OFFICE
CERTIFICATE OF CORRECTION

PATENT NO.     : 6,654,893 B1
DATED          : November 25, 2003
INVENTOR(S)    : Jaya Prakash Samala It is certified that error appears in the above-identified patent and that said Letters Patent is hereby corrected as shown below:

Column 4,
Line 44, replace "dynamic-flip-flop" with -- dynamic flip-flop --.

Column 5,
Line 59, replace "the." with -- the --.

Column 8,
Line 45, replace "sampled," with -- sampled; --.

Column 9,
Line 57, repalce "circuit," with -- circuit --.

Signed and Sealed this

Fifteenth Day of June, 2004

JON W. DUDAS
*Acting Director of the United States Patent and Trademark Office*